US006472705B1

(12) United States Patent
Bethune et al.

(10) Patent No.: US 6,472,705 B1
(45) Date of Patent: Oct. 29, 2002

(54) MOLECULAR MEMORY & LOGIC

(75) Inventors: Donald Stimson Bethune, San Jose, CA (US); Sandip Tiwari, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/195,083

(22) Filed: Nov. 18, 1998

(51) Int. Cl.$^7$ .......................... H01L 35/24; H01L 29/06
(52) U.S. Cl. .......................... 257/314; 257/24; 257/30; 257/40; 257/325; 438/99; 438/288; 438/780; 365/151
(58) Field of Search .............................. 257/12, 14, 24, 257/25, 30, 40, 41, 35, 314, 315, 321, 325; 438/99, 264, 288, 780; 365/151

(56) References Cited

U.S. PATENT DOCUMENTS

| 4,716,548 A | 12/1987 | Mochizuki .................. 365/149 |
| 5,196,396 A | 3/1993 | Lieber .......................... 505/460 |
| 5,227,038 A | 7/1993 | Smalley et al. ............. 204/173 |
| 5,250,378 A | 10/1993 | Wang .......................... 430/83 |
| 5,271,890 A | 12/1993 | Shimura et al. .............. 419/11 |
| 5,273,729 A | 12/1993 | Howard et al. ......... 423/445 B |
| 5,300,203 A | 4/1994 | Smalley ................. 204/157.41 |
| 5,316,636 A | 5/1994 | Bunshah et al. ....... 204/157.47 |
| 5,380,595 A | 1/1995 | Ueba et al. .................. 428/408 |
| 5,395,496 A | 3/1995 | Tsantrizos et al. .......... 204/173 |
| 5,420,746 A | 5/1995 | Smith .......................... 361/311 |
| 5,508,543 A | 4/1996 | Hartstein et al. ........... 257/314 |
| 5,556,517 A | 9/1996 | Smalley ................. 204/157.47 |
| 5,646,559 A * | 7/1997 | Higurashi .................... 326/136 |
| 5,693,977 A | 12/1997 | Haddon et al. ............. 257/431 |

FOREIGN PATENT DOCUMENTS

JP 09-082939 3/1997

OTHER PUBLICATIONS

Joachim et al., A Nanoscale Single–Molecule Amplifier and Its Consequences, Jan. 1998, IEEE, Proceedings of the IEEE, vol. 86, No. 1, pp. 184–190.*

Ohno et al., Photoluminescence of C60 nanocrystals embedded in a SiO Matrix, May 1, 1998, Amer. Inst. of Phys., J. of App. Phys., vol. 83, No. 9, pp. 4939–4943.*

Kastner et al., Fullerene Field–Effect Transistors, 1993, Springer–Verlag Berlin, Springer Series in Solid–State Sciences, vol. 113, pp. 512–515.

Dodabalapur et al., Heterojunction Organic Thin–Film Transistors, 1995, IEEE, Device Research Conference, Digest. 1995 53rd Annual, pp. 132–133.

Haddon et al., C60 Thin Film Transistors, May 1995, Amer. Inst. of Physics, Appl. Phys. Lett. 67 (1), pp. 121–123.

Joachim et al., An Electromechanical Amplifier Using a Single Molecule, Feb. 7, 1997, Elsevier Science, Chemical Physics Letters 265 (1997), pp. 353–357.

Brunsman, et al., "Characterization of ferromagnetic nanoparticles produced by a carbon arc", *Mat. Res. Soc. Symp. Proc.*, vol. 359, pp. 35–52, 1995.

Eklund, et al., "Optical and photochemical properties of $C_{60}$ films", *The International Society for Optical Engineering*, vol. 2284, pp. 2–20, 1994.

(List continued on next page.)

*Primary Examiner*—George C. Eckert, II
(74) *Attorney, Agent, or Firm*—Scully, Scott, Murphy & Presser; Marian Underweiser

(57) ABSTRACT

The present invention is directed to a microelectric device and especially a Field effect transistor comprising a source, drain, channel, an insulating layer overlying said channel containing at least one closed cage molecule, said closed cage molecule being capable of exhibiting a Coulomb blockade effect upon application of a voltage between said source and drain. Two different microelectronic devices are described containing the closed cage molecule, a logic cell and a memory cell.

8 Claims, 4 Drawing Sheets

OTHER PUBLICATIONS

Jacobs, et al., "Disilene Addition to $C_{70}$", *Mat. Res. Soc. Symp. Proc.,* vol. 359, pp. 363–372. 1995.

Kamalakaran, et al., "Formation and characterization of silicon nanoparticles–threads, tubules and possibly silicon fullerene–like structures", *J. Phys.: Condens, Matter* 7, L529–L535, 1995.

Osawa, et al., "Inter–cage orbital interactions in [2+2] and [4+4] dimers of buckministerfullerene", *Mat. Res. Soc. Symp. Proc.,* vol. 359, pp. 145–156, 1995.

Palstra, et al., "Superconductivity at 40K in Cesium Doped $C_{60}$", *Mat. Res. Soc. Symp. Proc.,* vol. 359, pp. 285–289, 1995.

Quesada–Hidalgo, et al., "The binary phase diagram naphthalene–$C_{60}$", *Mat. Res. Soc. Symp. Proc.,* vol. 359 pp. 561–566, 1995.

Reihl, "Geometric and Electronic Structure of Fullerene Film Growth as a Function of Coverage", *Mat. Res. Soc. Symp. Proc.,* vol. 359, pp. 375–399, 1995.

Tenne, et al., "Inorganic fullerenes of $MX_2$ (M=W, Mo; X=S, Se)", *Mat. Res. Soc. Symp. Proc.,* vol. 359, pp. 111–119, 1995.

Tiwari, et al., "Volatile and Non–Volatile Memories in Silicon with Nano–Crystal Storage," *Institute of Electrical & Electronic Engineers,* pp. 20.4.1–20.4.4, 1995.

Wilson, et al. "Functionalization of $C_{60}$ by Cycloaddition Reactions", *Mat. Res. Soc. Symp. Proc.,* vol. 359, pp. 357–361, 1995.

Xie, et al., "Electrochemical Detection of $C_{60}^{6-}$ and $C_{70}^{6-}$", *Journal of the American Chemical Society,* vol. 114, No. 10, pp. 3978–3980, 1992.

Tiwari, et al., A Silicon Nanocrystals Bead Memory', Appl. Phys. Lett. 68, Mar. 4, 1996, (pp. 1377–1379).

H.W. Croto, et al., "C60: Buckminsterfullerene", Letters to Nature, vol. 318, Nov. 14, 1985, (pp. 162–165).

W. Kratschmer, et al., "Solid C60: A New form of Carbon", Letters to Nature, vol. 347, Sep. 1990, (pp. 354–358).

\* cited by examiner

MOLECULAR MEMORY & LOGIC

FIELD OF THE INVENTION

The present invention is directed to microelectronic devices, especially field effect transistors (FETs), which utilize closed cage structures and/or derivatives thereof for transport and storage of electrons in logic and memory cells, respectively.

DISCUSSION OF THE PRIOR ART

Miniaturizing and size reductions of microelectronic transistors, such as field effect transistors, especially metal oxide semiconductor field effect transistors (MOSFETs), to their theoretically predicted miniaturization limits is not a simple task. As device sizes are scaled down in order to improve performance and to increase function per unit area, numerous fundamental problems arise in obtaining acceptably functioning devices. For example, as device sizes approach dimensions in 100 nm range, numerous problems occur in achieving the characteristics needed in the highly integrated circuits common today. For logic devices, these include sub-threshold conduction effects, output conductance and power gain of the device. For volatile memories, such as dynamic random access memories (DRAMs), and for non-volatile memory devices, such as electrically erasable programmable random access memory devices (EEPROMs and FLASHs), these include sub-threshold conduction which leads to leakage of the stored charge or the loss of the clearly defined threshold.

Recently, it has been disclosed that nanocrystals made from silicon are useful in memory elements due to large electrostatic energy at low capacitance resulting in a Coulomb barrier that can be seen for single electrons and due to the discreteness of the occupation states (See Tiwari, et al., *APP. Phys. Letter* 1996, 68, No. 10, 1377–1379). The Coulomb barrier can also be used to make a single electron transistor structure where the flow of electrons through small-sized regions is utilized for obtaining functions in logic. Although the nanocrystals are an attractive solution to the problem of scaling down transistor memories, they still have problems associated therewith. For example, the nanocrystals vary in size, and it has been found that the variation in size of nanocrystals affects and leads to variations in the Coulomb barrier, thereby limiting the injection of electrons and hence the voltage at which the injection of electrons takes place. Additional variations may also occur because the energy level of the eigenstates (the energy levels of nanocrystals) is also affected by the size of the nanocrystals. This problem is minimized if a large number of nanocrystals (e.g., exceeding at least 100) are used for suppressing these statistical fluctuation effects observed with the nanocrystals, but this solution also constrains the smallest size device that can be made.

Thus, the search has been continuing for an improved means utilizing a different constituent than the nanocrystals that would permit further scaling down and avoid the fluctuation effects discussed hereinabove.

Obviously, this constituent is required to meet certain criteria. For example, it must be capable of exhibiting Coulomb blockade when placed in a semiconductor device.

Coulomb blockade is a phenomena that occurs at very small dimensions wherein the lowering of capacitance of a confined region in space creates the need for a reasonably large electrostatic energy ($e^2/2c$) where e is the electron charge and c is the capacitance, equivalent to having an electrostatic barrier before an electron can be injected onto it. In other words, the electron is trapped or equivalently the flow of electrons is blocked as a result of the effect. Its central concept is that no current flows until the electron can charge a particle. For electrons to flow, they must pass from one material to another. This requires energy. The energy required to place an electron on a material is described by the equation:

$$E = \frac{1}{2}\frac{e^2}{c}$$

where E is the electrostatic energy required to place the electron on a material, c is the capacitance of the material, and e is the charge of the electron. Thus, as clearly seen by the equation, as the size of the capacitor becomes smaller, its capacitance also decreases, and the energy required to place an electron thereon becomes larger, i.e., the Coulomb blockade effect increases. Thus, the constituent used for the capacitor must exhibit this property. In fact, it is desirable that this constituent has a size or diameter of nanometer dimensions. Moreover, the size of the constituent should be reproducible and not variable, thereby avoiding the variations in the Coulomb. barrier due to size fluctuations as seen with nanocrystals.

In addition, it is preferred that the constituent has highly reproducible structures with controlled dimensions and electrical properties. Moreover, the constituent should have reproducible electron reception and transport properties. Finally, it should exhibit electrical conductivity and be stable, especially during a change in temperature.

The present inventors have found molecular constituents that fulfill these requirements. These molecules have closed cage structures, e.g., FULLERENES, and their derivatives and the corresponding silicon molecules, e.g. $Si_{28}$.

SUMMARY OF THE INVENTION

Accordingly, the present invention is directed to a microelectronic device in which a closed cage molecule is used. These molecules are nanometers in size. That is, the molecules have specific sizes. More specifically, the present invention is directed to a microelectronic device comprising a field effect transistor which comprises:

(a) a source and drain, the source and drain being comprised of a semi-conductor material doped with a first type of impurities;

(b) a channel extending from said source and drain and disposed therebetween, said channel comprised of said semi-conductor material doped with a second type of impurities;

(c) an insulating layer superimposed over said channel region, said insulating layer comprised of insulating material and at least one molecule having a closed cage structure, said molecule being capable of exhibiting Coulomb blockade and receiving and storing at least one electron emanating from either the source or drain or the channel upon application of sufficient voltage between said source and drain or channel and gate to overcome the Coulomb barrier; and (d) a third layer comprising a gate over the insulating layer.

Another embodiment of the present invention is directed to a microelectronic device comprising a source and drain of a semiconductor material doped with a first type of impurities, a substrate comprising said semiconductor material doped with a second type of impurities, the insulating layer and the gate, whereby the substrate contains a recess therein which is approximately equal to the width or length of a molecule having a closed cage structure so that the latter is held in place and is in electrical contact with the source and the drain and separated from the gate by the insulating layer.

Another embodiment of the present invention is directed to a microelectronic device comprising a source and drain both of which are comprised independently of a doped semiconductor or metal, a channel containing a molecule having a closed cage structure which is in electrical contact with the source and drain and separated from the gate by an insulator.

DETAILED DESCRIPTION OF THE INVENTION

Figure 1:
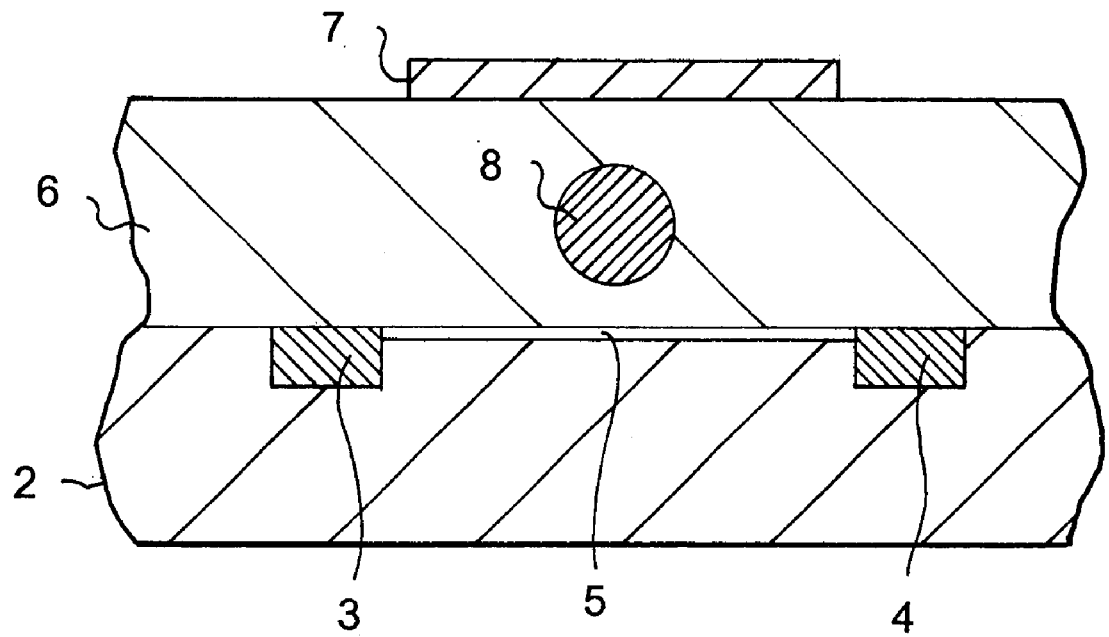
FIG. 1 illustrates cross-section of a memory cell in accordance with the present invention.

The present inventors have found that closed cage molecules, such as fullerenes and derivatives thereof can be used in microelectronic devices. By the term "closed caged molecules", it is meant a molecule being less than 100 nanometers in diameter, and more preferably less than 7 nanometers in diameter with the atoms thereof being arranged in a closed hollow cage. Preferably, the dimensions thereof are in the molecular range of 10 to 1000 atomic sizes. It is preferred that the size of the closed cage molecules used in the present invention ranges from about 0.4 to about 100 nm in diameter and more preferably from about 0.7 nm to about 20 nm.

These closed caged molecules, as used herein, exclude diamond and graphite. Examples include fullerenes and the silicon equivalents thereof, and derivatives of either of them, as defined hereinbelow. In particular, the present inventors have found that these molecules allow highly controllable and reproducible ways of implementing memory and logic which will operate at ultra low current, have strong non-linearities desired in conventional electronics and are relatively immune to the usual statistical fluctuation effects.

Fullerenes are a new class of molecules recently discovered. They aggregate to give a third form of carbon which is neither graphite nor diamond but instead is a molecular crystal consisting solely of molecules with even numbers of carbon atoms in closed caged structures. The most stable fullerenes contain at least 60 carbon atoms, and may contain up to 900 carbon atoms or higher. Examples include $C_{60}$, $C_{70}$, $C_{76}$, $C_{84}$, $C_{90}$, $C_{120}$, $C_{240}$ and the like. $C_{60}$, also known as buckminsterfullerene, was discovered by Smalley and Kroto, et al. by laser irradiation of graphite in an argon atmosphere, as described in Nature 1985, 318, 162–164. However, it was not until 1990 that fullerenes, e.g. $C_{60}$, were first made in macroscopic amounts by Huffman and Kratschmer; they vaporized graphite with resistive heating in the presence of helium to form a soot containing $C_{60}$ molecules, collected the sooty carbon and either sublimed the $C_{60}$ or extracted the $C_{60}$ with a non-polar organic solvent, as described in Kratschmer, et al. Nature, 1990, 347–354–358. Since then, fullerenes have been prepared by various techniques, such as those described in U.S. Pat. Nos. 5,227,038 to Smalley, et al., U.S. Pat. No. 5,271,890 to Shimura, et al., U.S. Pat. No. 5,273,729 to Howard, et al. U.S. Pat. No. 5,395,496 to Tsantrizos, et al., U.S Pat. No. 5,316,636 to Bunshah, et al., and U.S. Pat. No. 5,556,517 to Smalley, et al., the contents of all of which are incorporated herein by reference.

In the fullerene molecules, an even number of carbon atoms are arranged to form a closed hollow cage. Each atom is trigonally linked to its three neighbors by bonds that form a polyhedral network, consisting of 12 pentagons and n-hexagons. In fullerene $C_{60}$, e.g., all 60 atoms are equivalent and lie on the surface of a sphere with the atoms at the vertices of a truncated icosahedron, thus forming a soccer-ball pattern. The 12 pentagons are isolated and interspersed symmetrically with 20 linked hexagons to form the soccer-ball shape.

Three of the four carbon valences of the fullerene are $sp^2$ hybridized, with the fourth p-electron being in a p-delocalized molecular orbital sea that covers the outside (endo) and inside (exo) surface of the molecule.

Besides the hollow closed cage structures described hereinabove, elongated fullerenes called carbon tubules or nanotubules have also been prepared. They are essentially unadulterated graphite sheets rolled around to close upon themselves. Nanotubes can grow with a single atomic wall or in the form of many concentric cylinders. The carbon tubules are, for the most part, terminated with hemispherical carbon caps of hexagons and pentagons. These multiwall nanotubes have been found in the region at the electrode, while the single wall nanotubes—like the fullerenes described hereinabove—can be found in the soot that condenses away from the electrode. For example, see U.S. Pat. No. 5,424,054 to Bethune, et al., the contents of which are incorporated herein by reference.

In addition, it has also been found that in another form of fullerene, as many as several million carbon atoms arrange themselves to form onion skins of nested concentric fullerene shells, with the radius of each nested shell being three Å or larger than the shell below it. The large shells are made up of thousands of carbon atoms bonded together in the familiar pattern of hexagons and pentagons as described herein above (hereinafter these structures will be identified as "onions")

Derivatives of fullerenes are known. For example, they can be multiply hydrogenated, methylated, fluorinated or ammoniated. They may form exohedral complexes in which an atom or a group of atoms is attached to the outside of the cage. In addition, they may form endohedral complexes, in which a metal atom, e.g. lanthanum, potassium, calcium, cesium or the like is trapped inside. For example, see U.S. Pat. No. 5,300,203 to Smalley and U.S. Pat. No. 5,196,396 to Lieber, the contents of which are incorporated herein by reference. Thus, metal doped fullerenes, alkali doped fullerenes and doped nanotubes have been prepared.

All of these various fullerenes and derivatives thereof are contemplated to be used within the scope of the present invention. The term FULLERENE, as used herein, connotes all of the aforementioned fullerenes as well as the derivatives thereof. The term "fullerene" as used herein connotes closed-cage molecules comprised solely of carbon atoms which contain at least 60 carbon atoms. The derivatives are structures derived from this basic form.

Thus the FULLERENES are commercially prepared or are prepared by art recognized techniques utilizing the teachings in the above-identified patents. In fact, various FULLERENES products are commercially available through BUCKY USA. Examples include such FULLERENE products as $C_{60}$, $C_{70}$, $C_{76}$, C78, $C_{84}$ and the like. Metal endohedrals (e.g., metal @ $C_{2n}$, wherein n is greater than or equal to 30, utilizing such metals as La, Er, Gd, Ho, Nd, and the like, e.g., Ho @ $C_{82}$); multi-walled and single walled nanotubes; chemically modified fullerenes (e.g. fulleropyrrolidines, such as N-methyl-fulleropyrrolidine; N-ethyl-polyamino $C_{60}$ and ferrocenyl-fulleropyrrolidine, fullerenols ($C_{60}$ polyhydroxy), methanofullerene $C_{61}$ carboxylic acid, phenylalanine ethyl ester of N-methanofullerene ($C_{61}$) carboxylate, and the like), fullerene oxides (e.g., $C_{60}O$, $C_{70}O$ and the like), and the like have been produced and are also commercially available. The preferred FULLERENES are fullerenes, especially $C_{60}$ and $C_{70}$.

The FULLERENES form crystalline solids; they electroluminesce, they can be subliminated, they can be distributed in a $SiO_2$ film, and can receive at least up to six electrons. However, most importantly, the present inventors have found that these molecules possess many of the properties desired in a precisely sized nano-particles that can act as a storage and transport medium for electrons. More specifically, it has been found that FULLERENES possess the appropriate Coulomb blockage capabilities and are of the appropriate molecular size for their use in microelectronic devices. For instance, the following table summarizes the sizes of some of the common forms of FULLERENES and their derivatives thereof:

| FULLERENE Compound | Largest Dimension or Diameter (nm) | Lattice Constant in a Solid (nm) |
|---|---|---|
| $C_{60}$ | 0.7 | 1.416 |
| $C_{70}$ | 1 | |
| $C_{84}$ | 1 | 1.58 |
| La, Er, Gd, Ho, Nd, etc. @$C_{82}$ | 1 | |
| $Rb_2CsC_{60}$ | | 1.443 |
| Onion | 4–5 | |
| Nanotubes | 1–10 n min diameter × $10^3$ nm long | |

Moreover, the FULLERENES do not have dangling bonds on the molecular surface and exhibit excellent conduction properties.

In addition, the inventors have found that the corresponding silicon closed cage molecules also exhibit similar properties to the FULLERENES described hereinabove. The most preferred silicon analog is $Si_{28}$, $Si_{45}$, and the like. Like the FULLERENES, these silicon compounds are also small and have the desired sizes described hereinabove.

These silicon fullerenes are prepared by techniques known to the skilled artisan. See, for example, Kamalakaran, R., et al. *J. Phys. Condens Matter,* 1995, 7, pp. L529–L535, which shows an exemplary example of the preparation of silicon fullerenes.

The present invention is exemplified hereinbelow in various embodiments. Although these embodiments utilize specific fullerene molecules, these examples are not intended to limit the present invention. It is to be understood that other closed caged molecules, as defined herein, can be used in lieu of the ones specifically illustrated.

FIG. 1 illustrates an embodiment of the present invention utilizing a FULLERENE. It shows a cross section of a memory cell in accordance with one embodiment of the present invention. The memory cell contains a semiconductor substrate (2) and a region of the substrate identified as source (3) and drain (4) which are separated from each other by a channel (5) which extends from the source to the drain. The substrate is comprised of a semiconductor material that typically is employed in microelectronic devices. Examples of such semiconductor material include, but are not limited to, silicon, germanium, gallum arsenide, indium arsenide, silicon carbide, indium phosphide, and the like. A highly preferred material for the substrate (2) is silicon. The substrate may contain a dopant material that is conventionally used in this art.

As is well known, carriers are transported across the channel connecting the source (3) and drain (4) only in a thin region adjacent to the interface with the insulating material in the overlying layer (6). The source (3) and drain (4) regions are formed through conventional processing techniques known in the art, such as diffusion or ion implantation. The source (3) and drain (4) regions are formed by doping the substrate with the same dopant material, but this dopant material is different from the dopant material of the substrate (2). The dopant materials utilized are those conventionally used in microelectronic devices. Thus, the source (3) and drain (4) regions have the same impurity type, which is the opposite impurity type of the substrate. That is, when the substrate is a p-type, the source and drain regions are n-type and the FET is a n channel device. When the substrate is a n-type, the source and drain regions are p-type and the FET is a p channel device. A silicon-on-insulator having a source-channel-drain region is a type of memory cell that is also contemplated by the present invention. An insulating layer (6) is formed over the channel region (5) and between the source (3) and the drain region (4). It is generally comprised of a material conventionally used in this art. Suitable insulating materials include, but are not limited to, $SiO_2$, $Si_3N_4$, $TiO_2$, $Al_2O_3$, mixtures thereof, or combination thereof and the like. The preferred insulating material is $SiO_2$. The insulating material has a low charge carrier trap density at the interface with the channel region (5). The thickness of the insulating layer is thin, usually of the order of and excluding 0 to about 6 nm, and more preferably about 3 nm.

A control gate region (7) is formed on a layer above the insulating layer (6), but superposed between said drain and source. The gate (7) controls the flow of current in the channel region. It is typically a layer of polycrystalline silicon which is deposited on top of the insulating layer. The gate layer is normally heavily diffused with impurities so that it is a good conductor. The control gate is generally formed using doped polysilicon but may also contain a metallic conductor such as tungsten, tungsten silicide, tungsten nitride, titanium nitride, and the like. It acts as one plate of a capacitor with the relatively low conductivity channel region in the substrate acting as the other plate. The gate has the effect of turning "on" or "off" the FET and, in turn, programming the memory.

The insulating layer contains at least one closed cage molecule, such as FULLERENE (8), as defined hereinabove, dissolved therein. The closed cage molecule acts as a receiver of electrons. For example, in the case of $C_{60}$, as many as six electrons can be placed, i.e., stored thereon.

Figure 2:
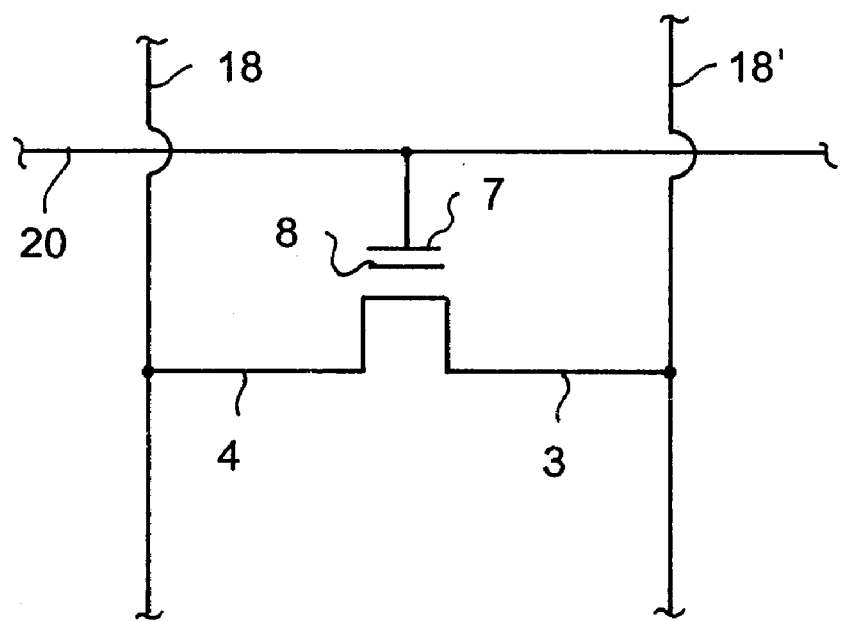
FIG. 2 shows a memory cell circuit for a memory cell in accordance with the present invention.

The operation of this embodiment of the memory cell of the present invention is illustrated in FIG. 2, for a n-channel device, where wordline 20 is connected to the control gate (7), a bitline 18 is connected to drain (4), and source line 18' is connected to source (3). Data is written to the memory cell by applying a first charge voltage on the wordline 20 with bitline 18 and source line 18' grounded. The first charge voltage is preferably less than approximately 5 volts.

Once data has been written to the memory cell, the voltage is disconnected from the wordline and bitline and source line and the charge remains in the memory cell. The existence of charge (and hence, data) in the memory cell is detected by sensing the threshold voltage, i.e., the state of conduction of the device. This is the read cycle of the device. When current is sensed during the read time in the bitline 18, then no charge is in the closed cage molecule (8), e.g., FULLERENE. When very low current is sensed during the read time, then the charge is stored in the closed cage molecule (8), e.g. FULLERENE. The existence of charge in the closed cage molecule (8) e.g., FULLERENE, represents either a data value 1 or 0 in the memory cell as desired. A specific number of electrons can be stored by the closed cage molecule, e.g., up to six electrons can be stored in certain FULLERENES, e.g., such as $C_{60}$. These types of FULLERENES, e.g., $C_{60}$, contain up to six states of conduction and are used to store data, i.e., 0, 1, 2, 3, 4, and 5.

Data is erased from the closed cage molecule by applying an erase voltage which is substantially equal to the first charge voltage on bitline 18 and source line 18' while connecting the wordline 20 to a low voltage such as a ground.

Proper operation of the memory cell according to this invention depends upon the fact that the tunneling of charge carrier, which is by tunneling, into the closed cage molecule is faster than tunneling out of the closed cage molecule under conditions of write and read cycles.

Without wishing to be bound, it is believed that the memory cell functions as follows. When a sufficiently positive potential is applied to the gate electrode, it electrostatically attracts a negative charge on the semiconductor and acts to repel the majority carrier holes from the surface of the substrate. As the potential applied to the gate is increased, so too does the concentration of minority carrier electrons at the interface between the insulating layer and the substrate and eventually this becomes comparable with the density of majority carrier holes. If a sufficiently large potential is applied at the gate, then the electron density at the surface will exceed the hole density and produce a so-called inversion layer. Since the inversion charge at the insulating layer-semiconductor interface provides a conducting channel between the source and drain, a potential difference applied between these two electrodes will cause a current I to flow between them. The device is then said to be in the ON state and the gate voltage which is required to allow conduction to occur is known as the threshold voltage. (Prior to inversion, there is no conduction within the channel, and hence no current can flow and the device is said to be OFF).

When the device is ON, injection of an electron occurs from the inversion layer via direct tunneling to the closed cage molecule, i.e., the electrons are induced and arrive from the source electrode. The resulting stored charge screens the gate charge and reduces the conduction in the inversion layer, i.e., for each electron added to the closed cage molecule, the conduction of the underlying medium changes. In other words, it effectively shifts the threshold voltage of the device to be more positive. The amount of charge is detected by finding the current between the source and the drain (the electron reservoirs) at a specific gate voltage applied to the gate. The threshold voltage change due to the storage of N electrons is given by the equation:

$$\Delta V_T = \frac{eN}{\epsilon_{ins}}\left(t_{cntl} + \frac{1}{2}\frac{\epsilon_{ins}}{\epsilon_{nano}}\phi_{nano}\right)$$

Here, $\Delta V_T$ is the threshold voltage shift, N is the number of electrons stored in the closed cage molecule of diameter $\phi$ nano, e is the magnitude of the electronic charge, $\epsilon$'s are the permitivities, $\epsilon_{ins}$ is the permitivity of the insulating layer, $\epsilon_{nano}$ is the permitivity of the closed cage molecule, $t_{cnt}$ is the thickness of the insulating layer above the closed cage molecule, and $\phi$ nano is the diameter of the closed cage molecule. The amount of current charge (I) that can be controlled by the presence of N number of electrons in the semiconducting channel is given approximately by the following equation:

$$I = ev_f \frac{N}{t_{nano}}$$

where $t_{nano}$ is the control distance between the closed cage molecule and channel and $v_f$ is the controlling velocity for transport in the channel—of the order of Fermi velocity—having a current exceeding nA.

As shown by the equations, the thickness of the insulator will affect both the threshold voltage and the current charge. Preferably, the thickness of the insulator is very small. For example, it can be only a few monolayers thick, similar in size to the closed cage molecule, e.g., on the order of magnitude of nanometers or larger ranging from, but excluding, 0 nm to about 20 nm and more preferably from and excluding 0 to about 10 nm.

The Coulomb effects are also very significant at these dimensions. The Coulomb charging energy $\Delta V$ is $$\Delta v = \frac{e}{2c_{nano}}$$

where e is the charge of one electron and $C_{nano}$ is the capacitance of the closed cage molecule. Since the size of the closed cage molecule is very small, i.e., it is on the order of a nanometer, its capacitance becomes very small. As a result, the energy required to place an electron on the closed cage molecule becomes large—e.g., larger than room temperature thermal energies of the electrons. For such conditions, the conduction of electrons through the material is blocked for a measurable voltage range because they do not have sufficient energy. Thus, the closed cage molecules exhibit Coulomb blockade.

The semiconductor device of the present invention used for memory is prepared utilizing techniques known in the art. For example, a thin insulating layer, e.g., $SiO_2$, is grown on the silicon surface of the substrate. The thickness of the insulating layer ranges from about 1 to about 10 nm, and more preferably from about 1 to about 3 nm. A monolayer of the closed cage molecule, e.g. fullerene, e.g. $C_{60}$, is deposited thereon. This may be accomplished by sublimination of a monolayer of the closed cage molecule or by depositing the same onto the insulating layer from either the liquid or vapor phase. Another insulating layer is deposited on this. The polysilicon or metal gate is deposited onto the insulator covering the closed cage molecule and the gate is patterned by techniques known in the art. The electrical connection in the device and drain are formed and interconnected by techniques known to the skilled artisan. By this method, the memory cell of the present invention is prepared.

Figure 3:
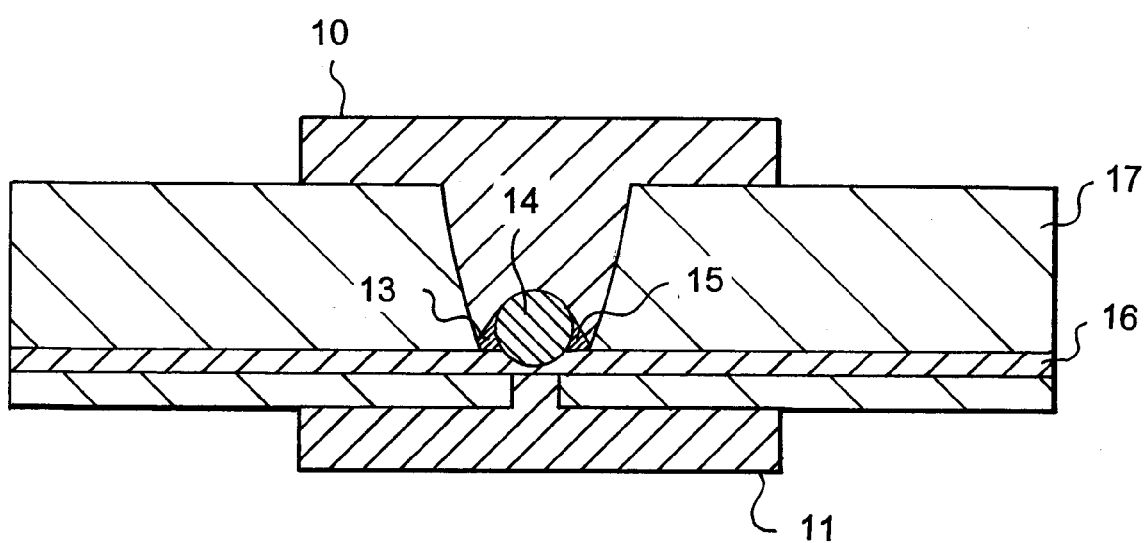
FIG. 3 is a cross-section of a logic cell in accordance with the present invention.

Another embodiment of the present invention, is depicted in FIG. 3, which is a cross-sectional view of a logic device. The logic device contains a semiconductor substrate (17) as in the memory cell described hereinabove, the contents of which are incorporated by reference. The device has a source (10) and a drain (11) separated by a channel, which is located in a recess or gap region in the substrate into which the closed cage molecule (14) is situated. The gap region is of about the dimension of the closed cage molecule (14), but sufficiently large to fit it. The channel is comprised of the closed cage molecule. Again, as in the other embodiment, the source and drain are comprised of a semi-conductor material doped with a first type of impurities. The gap region is recessed in the silicon wafer, which is comprised of said semiconductor material doped with a second type of impurities, and this dopant material is different from the dopant material of the source and drain. The dopant materials and the substrate (17) utilized are those conventionally used in microelectronic devices.

As in the other embodiment, the source 10 and drain (11) are usually heavily doped (either n or p-type) with material normally utilized in this field in concentration amounts that are normally utilized in the source and drain of microelectronic devices, such as, for example, between the range of about $0.8 \times 10^{18}/cm^3$ to about $3 \times 10^{20}/cm^3$. Alternatively, they can be made with metals, such as tungsten, and the like.

As in the previous embodiment there are three layers. The source (10) and drain (11) and channel being the lower layer, the insulating layer (13) being the middle layer, and the gate being the upper layer (16). The insulating layer (13) is superposed over the channel, which is comprised of the closed cage molecule (14). However, unlike the previous embodiment, the width of the channel is very small, i.e., the channel region has a width ranging. from about 0.05 nm to about 50 nm and more preferably from about 0.05 nm to about 2 nm. In addition, a recess is built into the channel region about the size of the diameter of a closed cage molecule, i.e., of the order of about 0.4 nm to about 100 nm and more preferably from about 0.4 nm to about 50 nm and even more preferably from about 0.7 nm to about 20 nm. The recess is about the same size as the closed cage molecule that is being used and serves to hold the closed cage molecule in place. Thus, for example, if the closed cage molecule were $C_{60}$, then the recess should be about 0.7 nm in size (diameter). If the closed cage molecule were $C_{70}$, it would be about 1 nm in size (diameter). On the other hand, if the closed cage molecule were a nanotube, the size of the recess should be about 5 to 10 nanometers.

Unlike the previous embodiment wherein the closed cage molecule is surrounded by the insulating layer, in this embodiment, the closed cage molecule is in electrical contact with both the drain (11) and the source (10) and forms the channel. A substrate (17) where the gate (16) pre-exists is used. For example, a silicon-on-insulator (as described hereinabove with respect to the memory cell) is typically used. It is preferred that a gate oxide (15) is formed over the recessed region and the gate (16) prior to the deposition of the closed cage molecule (14).

The gate oxide is comprised of materials conventionally used in semiconductors, e.g., $SiO_2$, and the like. If present, the gate oxide layer is preferably less than 50 Å, and more preferably it ranges from about 10 Å to about 40 Å. A gate region (16) is separated from the closed cage molecule by the gate oxide layer (15) but is in intimate electrical capacitance contact with the closed cage molecule (14). It is electrically isolated from the source (10) and drain (11). The gate has non-linear input-output characteristics together with thermal immunity.

Without wishing to be bound, it is believed that the closed cage molecule helps to control the flow of the electrons between the source and the drain when the voltage is applied. As a result of the proximity of the closed cage molecule to the source and drain, the electron is required to be transported through the closed cage molecule. Since the closed cage molecule and capacitance thereof are very small, the Coulomb energy required by $\frac{1}{2} e^2/c$ (where e and c are as defined above) is large so that electron flow will not occur until the proper voltage is provided. When the proper voltage is applied, then the electron will flow through the closed cage molecule. If for example, the closed cage molecule is a FULLERENE, e.g., fullerene, such as $C_{60}$, up to six electrons can flow under different voltage conditions.

The logic cell is made by first preparing the semiconductor substrate, e.g., silicon semiconductor substrate by techniques known in the art. A gate is formed thereon by techniques known in the art, such as deposition, implantation and patterning. An insulating layer, e.g., an oxide region is formed in the surface of the semiconductor substrate using conventional techniques known in the art. One way of forming the oxide region in the semiconductor substrate is by growth.

A photoresist mask layer is further deposited thereon. The mask layer is selectively etched away by techniques known in the art, such as photolithography techniques, to form a recess. The desired amount of the closed cage molecule is placed in the recess, optionally with an intervening oxide. The electrodes, i.e., the source and the drain and gate are formed on the silicon wafer and the electrodes are interconnected by techniques known in the art.

Figure 4:
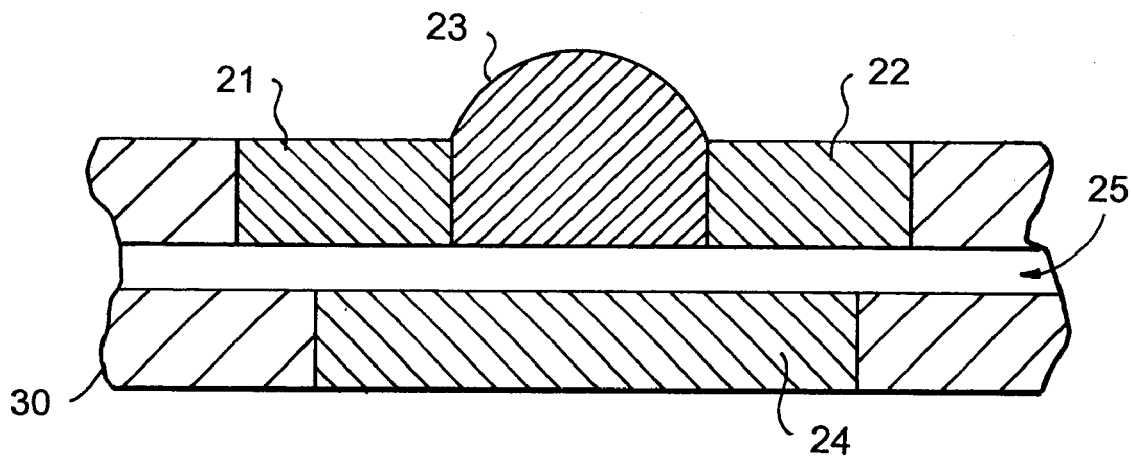
FIGS. 4–6 are cross-sections of additional embodiments of logic cells in accordance with the present invention.
Figure 5:
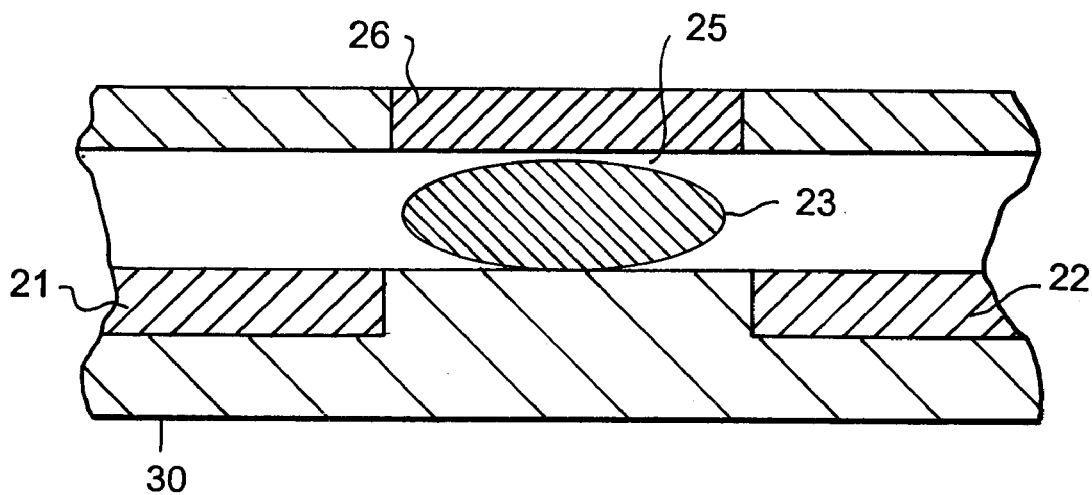
Figure 6:
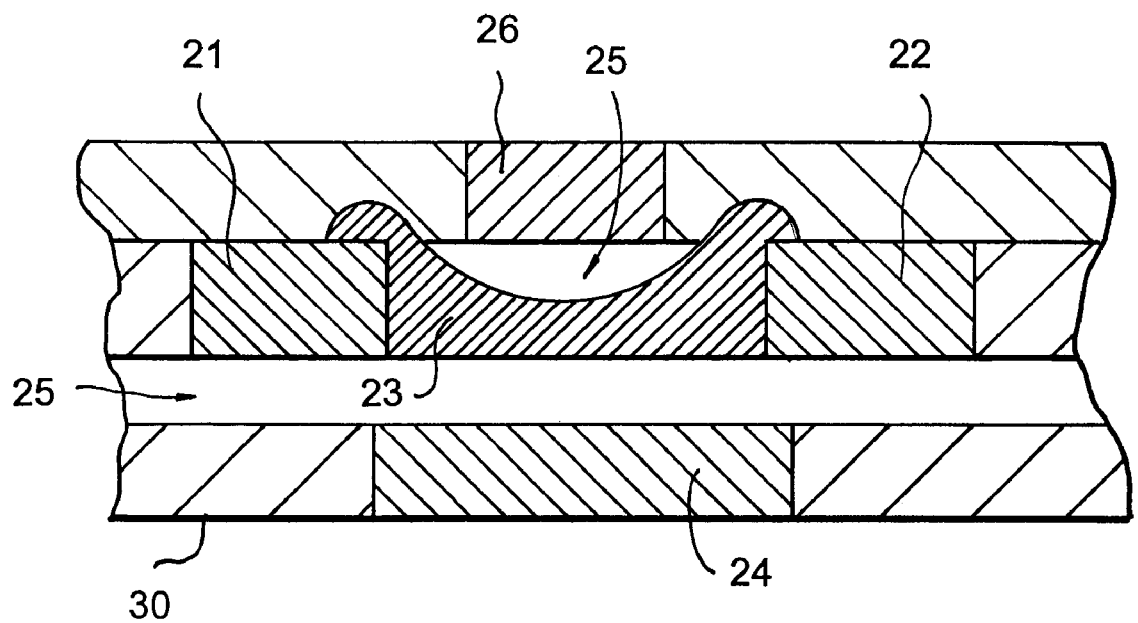

Additional alternative embodiments of the present invention are depicted in FIGS. 4–6. FIG. 4 depicts a variation of the embodiment shown in FIG. 3 and described hereinabove. The logic cell contains a semiconductor substrate (30) as in the previous embodiment. A region of the substrate consists of a source (21) and drain (22) and a recess (gap) in the substrate separating the source and drain (channel). The source (21) and drain (22) electrodes consist of doped semiconductor or metal, as described hereinabove and both are located in a layer on top of the insulating layer (25), the latter being comprised of insulating material described hereinabove with respect to FIG. 3. (23) is the molecule of closed cage structure. It is situated in the recessed region of the substrate ("gap") described hereinabove and is in electrical contact with the source (21) and the drain (22) through which conduction takes place. The closed cage molecule forms the channel for conduction. This conduction is controlled by a gate (24) which may be located in the lower layer below the insulator (25) (see FIG. 4). Alternatively, this conduction is controlled by a gate (26) located in the upper layer on top of the molecule of closed cage structure, as depicted in FIG. 5 or by two gates (24) and (26), the former of which is located in the lowermost layer below the insulator and the latter located in the uppermost layer above the molecule of close caged structure (23) (see FIG. 6).

FIGS. 1–6 illustrate the present invention with only one closed cage molecule being utilized; however, the present invention also contemplates the use of more than one closed cage molecule. However, since the use of closed cage molecules permits scaling of the FET, there is a preferred limit as to the concentration of closed cage molecule utilized. Of course, this amount is dependent upon the type of cell utilized. For a memory cell, the number of closed cage molecules utilized preferably ranges from about 1 to about 100 and most preferably from about 1 to about 10 and more preferably from about 1 to about 50. On the other hand, in the logic cell, preferably only one closed cage molecule is utilized.

As used herein, the singular and plural are used interchangeably; thus the singular connotes the plural and vice-versa.

While the invention has been particularly shown and described with respect to illustrative and preferred embodiments thereof, it will be understood by those skilled in the art that the foregoing and other changes in the form and details may be made therein without departing from the spirit and scope of the present invention, which should be limited only by the scope of the appended claims.

What is claimed is:

1. A microelectronic device comprising a field effect transistor comprising a substrate having a source and a drain region separated by a channel region, a layer of insulating material overlying said channel region, and a gate overlying said layer of insulating material, said insulating material containing at least one cage molecule having a closed hollow shell, said cage molecule being substantially comprised of carbon atoms or silicon atoms having the ability to conduct electrons, exhibit Coulomb barrier, and to receive and store at least one electron from the the source, drain or channel regions upon application of sufficient voltage between said source region and said drain region and the gate to overcome said Coulomb barrier.

2. The microelectronic device according to claim 1 wherein said cage molecule is a FULLERENE or corresponding silicon molecule.

3. The microelectronic device according to claim 1 wherein said closed cage molecule ranges in size from 0.4 to about 100 nm.

4. The microelectronic device according to claim 2 wherein said FULLERENE is fullerene, fullerene oxide, a metal endohedral of fullerene, fullereneopyrrolidine, methanofullerene, multi-walled or single-walled carbon nanotube, fullerenol, an onion, doped nanotube or fullerene oxide.

5. The microelectronic device according to claim 4 wherein said FULLERENE is fullerene.

6. The microelectronic device according to claim 2 wherein said closed cage molecule is a fullerene which is capable of storing between 1 and 6 electrons.

7. The microelectronic device according to claim 2 wherein said closed cage molecule is $Si_{28}$, $C_{60}$ or $C_{70}$.

8. The microelectronic device according to claim 7 wherein said closed cage molecule is $C_{60}$.

* * * * *